United States Patent
Yang et al.

(10) Patent No.: US 8,089,713 B2
(45) Date of Patent: Jan. 3, 2012

(54) DETECTION OF HARD-DISC DEFECT REGIONS USING SOFT DECISIONS

(75) Inventors: Shaohua Yang, San Jose, CA (US); Weijun Tan, Longmont, CO (US)

(73) Assignee: LSI Corporation, Milpitas, CA (US)

(*) Notice: Subject to any disclaimer, the term of this patent is extended or adjusted under 35 U.S.C. 154(b) by 0 days.

(21) Appl. No.: 12/731,381

(22) Filed: Mar. 25, 2010

(65) Prior Publication Data

US 2011/0235204 A1  Sep. 29, 2011

(51) Int. Cl.
*G11B 27/36* (2006.01)
*H03M 13/03* (2006.01)

(52) U.S. Cl. .......................................... 360/31; 714/795

(58) Field of Classification Search ................. None
See application file for complete search history.

(56) References Cited

U.S. PATENT DOCUMENTS

| | | | |
|---|---|---|---|
| 6,104,331 A | 8/2000 | Ishida et al. | |
| 6,175,459 B1 | 1/2001 | Tomita | |
| 6,414,806 B1 | 7/2002 | Gowda et al. | |
| 6,665,134 B2 | 12/2003 | Ottesen et al. | |
| 6,671,111 B2 | 12/2003 | Ottesen et al. | |
| 7,237,173 B2 | 6/2007 | Morita et al. | |
| 7,595,948 B1 | 9/2009 | Oberg | |
| 7,646,556 B1 | 1/2010 | Kose et al. | |
| 7,679,853 B2 | 3/2010 | Song et al. | |
| 2002/0048108 A1* | 4/2002 | Chu et al. | 360/53 |
| 2008/0104486 A1 | 5/2008 | Kanaoka | |
| 2008/0262643 A1 | 10/2008 | Creigh et al. | |
| 2009/0231116 A1 | 9/2009 | Takahashi et al. | |
| 2009/0235146 A1 | 9/2009 | Tan et al. | |
| 2009/0268848 A1 | 10/2009 | Tan et al. | |
| 2009/0271670 A1 | 10/2009 | Tan et al. | |
| 2010/0226033 A1* | 9/2010 | Tan et al. | 360/53 |

FOREIGN PATENT DOCUMENTS

EP  0 785 552 A1  7/1997

* cited by examiner

*Primary Examiner* — Daniell L Negron
*Assistant Examiner* — Regina N Holder
(74) *Attorney, Agent, or Firm* — Mendelsohn, Drucker & Associates, P.C.; Steve Mendelsohn

(57) ABSTRACT

In a hard-disc drive, a defect region on the hard disc is detected by generating two statistical measures (e.g., $\beta_1(k)$ and $\beta_2(k)$) based on signal values (e.g., $x[n]$ or $y[n]$) and soft-decision values (e.g., $L[n]$) corresponding to the signal values. The measures are compared to detect the location of the defect region of the hard drive. Using the soft-decision values reduces fluctuations in a ratio of the statistical measures compared to a ratio formed from statistical measures that are not based on soft-decision values, resulting in a more-reliable test for detecting defect regions.

19 Claims, 2 Drawing Sheets

DETECTION OF HARD-DISC DEFECT REGIONS USING SOFT DECISIONS

CROSS-REFERENCE TO RELATED APPLICATIONS

The subject matter of this application is related to the subject matter of U.S. patent application Ser. No. 11/319,319 filed Dec. 28, 2005, U.S. patent application Ser. No. 12/111,255 filed Apr. 29, 2008, and U.S. patent application Ser. No. 12/707,820 filed Feb. 18, 2010, the teachings of all of which are incorporated herein by reference in their entirety.

BACKGROUND

1. Field of the Invention

The present invention relates to hard-disc drives, and, in particular, to techniques for detecting defect regions on a hard disc of a hard-disc drive, where the defect regions correspond to either thermal asperity or media defect.

2. Description of the Related Art

This section introduces aspects that may help facilitate a better understanding of the invention. Accordingly, the statements of this section are to be read in this light and are not to be understood as admissions about what is prior art or what is not prior art.

An ideal hard disc of a hard-disc drive has a data-storage surface that is perfectly flat and of perfectly uniform material composition. In reality, however, hard discs are not perfectly flat and have varying material composition. As a result of this, as well as for manufacturing reasons, different types of defects can be present on hard discs. It can be difficult to recover data read from defect regions, and the intensity of difficulty depends on the type of defect. In drop-out type defect regions, the amplitude of the analog read-head output signal is significantly lower than the read-head output signal amplitude for normal regions that are relatively flat and of relatively uniform material composition. Data written on such defect regions may be recovered if the read-head output signal is appropriately amplified and conditioned by the electronics that process the read-head output signal. In this document, we refer to such drop-out type defects as "media defects" (MD). It is desirable to determine the locations of MD regions on hard discs so that the signals read from those MD regions can be properly processed to recover the data accurately.

Sometimes, the topography of a hard-disc region is so varied that the read head will come into physical contact with certain regions when the read head is positioned over these regions of the spinning hard disc due to the asperities present on the disc. Such regions are referred to as thermal asperity (TA) regions, due to the frictional heat generated from the physical contact between the read head and the varied hard disc. It is desirable to determine the locations of TA regions on hard discs so that those regions can be avoided during both data write and data read operations to prevent damage to the read head.

Current and older hard-disc drives employed MR (magneto resistive) read heads or GMR (giant MR) read heads. For such read heads, read-head output signals corresponding to MD regions have amplitudes that are significantly smaller than the signal amplitudes for normal regions, while read-head output signals corresponding to TA regions have amplitudes that are significantly greater than the normal-region signal amplitudes due to a shift in baseline resulting from the TA effect. As such, MD regions can be located on a hard disc of a hard-disc drive employing an MR/GMR read head by looking for lower-than-normal signal-amplitude regions, while TA regions can be located on the hard disc by looking for significant increases in signal baseline compared to normal signal-amplitude regions.

Newer hard-disc drives employ TMR (tunneling MR) read heads. For TMR read heads, TA regions can be mistaken for MD regions because read-head output signals corresponding to both MD regions and TA regions have amplitudes that are significantly smaller than the signal amplitudes for normal regions. As such, the conventional signal-processing techniques used to detect MD and TA regions for hard-disc drives employing MR/GMR read heads cannot be used to detect MD and TA regions for hard-disc drives employing TMR read heads.

SUMMARY

In one embodiment, the present invention is a machine-implemented method for detecting a defect region on a hard drive. The machine generates and compares first and second measures based on signal values and soft-decision values corresponding to the signal values and detects the defect region based on the comparison.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
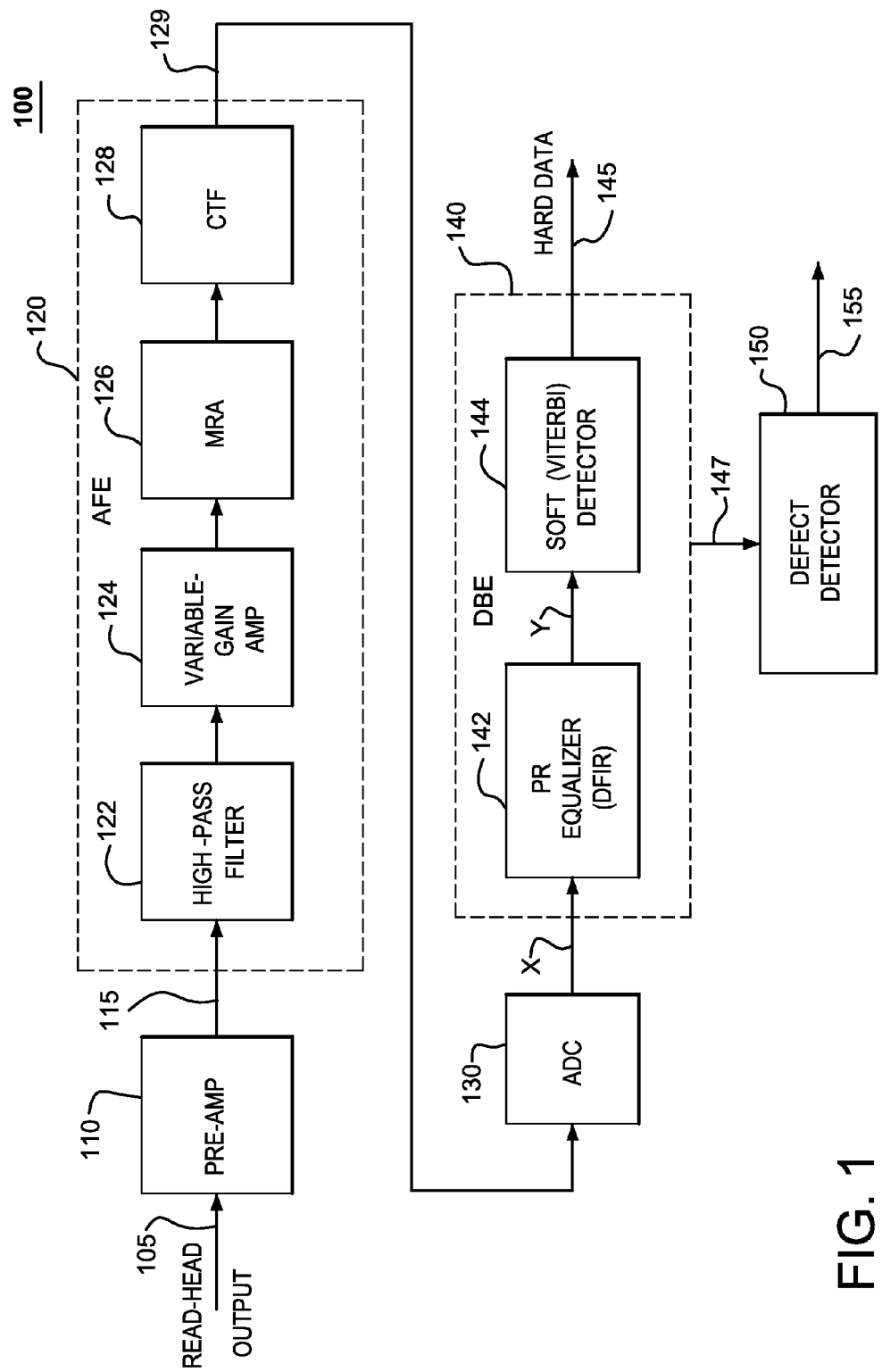
FIG. 1 shows a high-level block diagram of a read channel for a hard-disc drive employing a tunneling magneto resistive (TMR) read head, according to one embodiment of the present invention.

FIG. 1 shows a high-level block diagram of a read channel 100 for a hard-disc drive employing a tunneling magneto resistive (TMR) read head, according to one embodiment of the present invention. The (conventional) main signal-processing path of read channel 100 receives analog read-head output signal 105 from the TMR read head (not shown) and outputs binary (hard-decision) output data signal 145.

As shown in FIG. 1, read channel 100 includes pre-amplifier 110, analog front end (AFE) 120, analog-to-digital converter (ADC) 130, and digital back end (DBE) 140. Pre-amplifier 110 amplifies and conditions read-head output signal 105 to ensure that the signal amplitude and frequency components are within specified ranges for processing by AFE 120, which further amplifies and conditions the pre-amplified signal 115 from pre-amplifier 110. ADC 130 digitizes the AFE output signal 129 to produce multi-bit digital signal X for digital signal processing by DBE 140 that generates binary output data signal 145. Digital signal X consists of ADC output samples x[n], which are also referred to herein as equalizer input samples x[n].

As represented in FIG. 1, AFE 120 includes high-pass filter 122, variable-gain amplifier 124, magneto resistive asymmetry (MRA) compensation module 126, and continuous-time low-pass filter 128, while DBE 140 includes partial-response (PR) equalizer 142 and soft (e.g., Viterbi) detector 144. Of particular interest to the present invention, PR equalizer 142 receives digitized ADC output signal X from ADC 130 and generates multi-bit equalized signal Y (consisting of equalizer output samples y[n]), which soft detector 144 processes to generate one-bit binary (i.e., hard-decision) output data signal 145. In addition to generating hard-decision data 145, soft detector 144 also generates, as part of its processing, multi-bit soft-decision data, such as log-likelihood ratio (LLR) data. PR equalizer 142 can be, but does not have to be, implemented as a digital finite impulse response (DFIR) filter.

In addition, TMR read channel 100 includes defect detector 150, which receives and processes signal 147 from DBE 140 to detect the locations of defect regions on the hard disc, which information is represented in signal 155. In one implementation, signal 147 includes the ADC output signal X generated by ADC 130 as well as soft-decision data generated by soft detector 144. In another implementation, signal 147 includes the equalized signal Y generated by PR equalizer 142 as well as soft-decision data generated by soft detector 144.

In theory, defect regions on a hard disc can be detected by generating and comparing two statistical measures $\alpha_1(k)$ and $\alpha_2(k)$ defined according to Equations (1) and (2) as follows:

$$\alpha_1(k) = \Sigma_{i=0}^{M-1} y[k-i] \hat{y}[k-i] \quad (1)$$

$$\alpha_2(k) = \Sigma_{i=0}^{M-1} \hat{y}[k-i] \hat{y}[k-i] \quad (2)$$

where y[k-i] is the (k-i)th equalizer output sample and $\hat{y}[k-i]$ is the corresponding expected value of that (k-i)th equalized output sample. According to one possible implementation, if $\alpha_1(k) < C\alpha_2(k)$, where C is a specified fraction less than 1 (e.g., 0.5-0.7), then the kth sample is said to correspond to a defect region.

In one embodiment of the present invention, defect detector 150 detects defect regions on a hard disc by generating and comparing two statistical measures $\beta_1(k)$ and $\beta_2(k)$ defined according to Equations (3) and (4) as follows:

$$\beta_1(k) = \Sigma_{i=0}^{M-1} y[k-i] \hat{y}[k-i] abs(L[k-i]) \quad (3)$$

$$\beta_2(k) = \Sigma_{i=0}^{M-1} \hat{y}[k-i] \hat{y}[k-i] E(abs(L)) \quad (3)$$

where y[k-i] is the (k-i)th equalizer output sample generated by equalizer 142 of FIG. 1, $\hat{y}[k-i]$ is the corresponding expected value of that (k-i)th equalized output sample, L[k-i] is the corresponding multi-bit soft-decision value generated by soft detector 144 of FIG. 1 for that (k-i)th equalized output sample, and E(abs(L)) is the result of applying an expectation function E to the absolute value of soft-decision values L[n] corresponding to defect-free regions, which result can be obtained using a least-mean-squares (LMS) or other suitable algorithm. An LMS estimator for $E(abs(L)) \approx \hat{L}$ can be obtained as follows:

$$\hat{L}(k) \leftarrow \hat{L}(k-1) + \mu(abs(L[k]) - \hat{L}(k)) \quad (5)$$

Here, the value of $\mu$ is the adaptive gain value for the LMS estimation, and it is typically small. A typical value for M is 32, which implies that the first and second statistical measures $\beta_1(k)$ and $\beta_2(k)$ are both moving averages.

Depending on the particular implementation, the expected sample values $\hat{y}[n]$ can be generated in a number of different ways. One way is to construct $\hat{y}[n]$ by convolving the hard-decision bits (represented by 1 and -1) of output signal 145 generated by soft detector 144 with an appropriate target polynomial.

Another way is to generate long-term average values of the equalizer output sample y[n] for different short-term bit patterns. For example, if test data written to the hard disc followed a 2 T sequence (i.e., 11001100 . . . ), then different long-term average values could be generated for bit values at the center of different local bit patterns. In particular, one long-term average value could be generated for the bit at the center of the local 3-bit pattern "110", another for "100", another for "001", and yet another for "011". The appropriate long-term average, e.g., stored in a lookup table, could then be used for the expected sample value $\hat{y}[n]$ in Equations (1) and (2). Note that the expected sample values $\hat{y}[n]$ are generated for data stored in normal regions (i.e., not those associated with MD or TA). Those skilled in the art will understand that there may be other ways for generating the expected sample values $\hat{y}[n]$.

Figure 2:
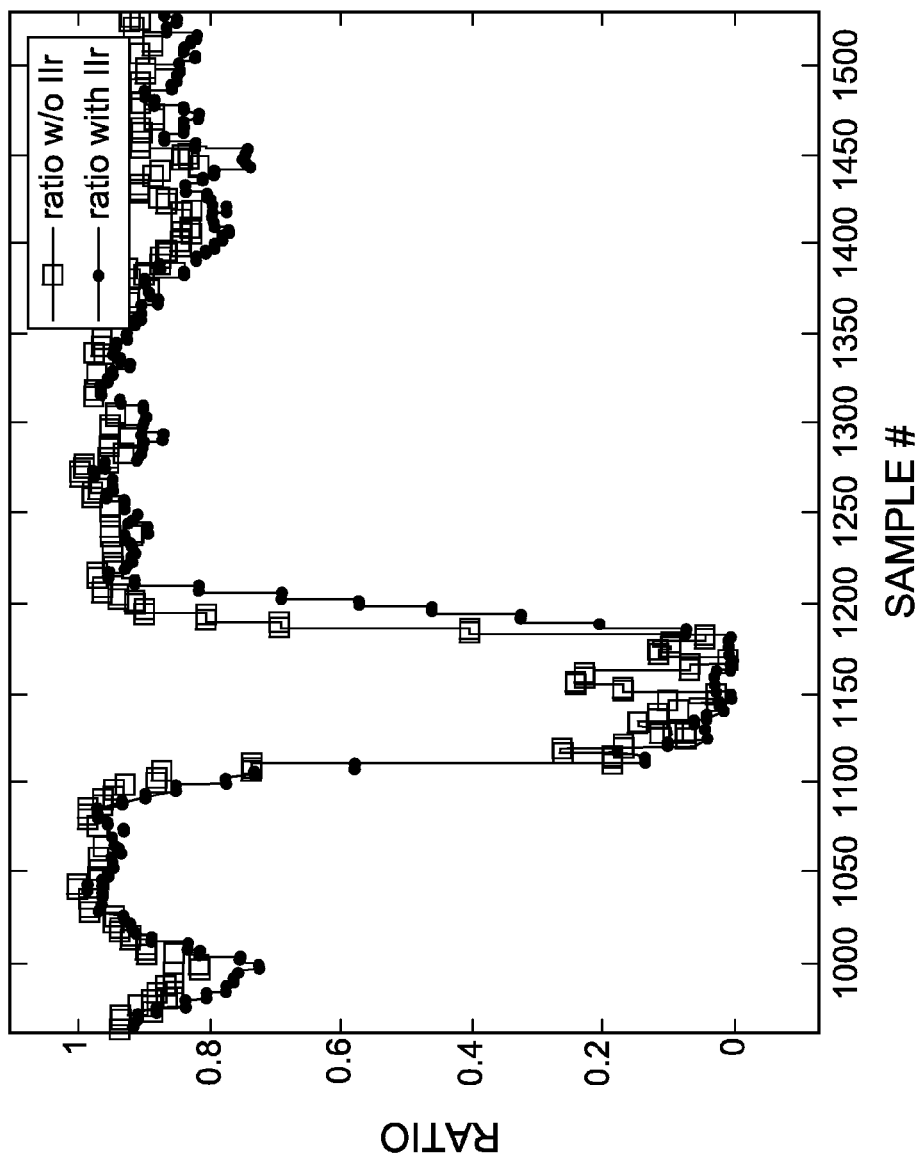
FIG. 2 graphically represents the characteristics of defect detection according to one embodiment of the present invention.

FIG. 2 graphically represents two ratios: a first ratio $\alpha_1(k)/\alpha_2(k)$ generated using the statistical measures of Equations (1) and (2), which are not dependent on any soft-decision (i.e., LLR) values, and a second ratio $\beta_1(k)/\beta_2(k)$ generated using the statistical measures of Equations (3) and (4), which are dependent on soft-decision values. In FIG. 2, a defect region spans from about sample no. 1100 to about sample no. 1200, with a normal (i.e., defect-free) region before and another normal region after that defect region. As evident in FIG. 2, for the two normal regions, both the first and second ratios have values relatively close to 1.0, while, for the defect region, both the first and second ratios have values significantly smaller than 1.0.

Note that, as also evident in FIG. 2, the second ratio has much less fluctuation in the defect region than does the first ratio. This characteristic implies that using the soft-decision-based statistical measures $\beta_1(k)$ and $\beta_2(k)$ to detect defect regions can be more reliable than using the statistical measures $\alpha_1(k)$ and $\alpha_2(k)$, which are independent of soft-decision values. In particular, using the soft-decision-based statistical measures $\beta_1(k)$ and $\beta_2(k)$ may result in fewer false-negative detections of defect regions. A good threshold is picked to minimize both false-detection and miss-detection probabilities.

According to one implementation of the present invention, the statistical measure $\beta_1(k)$ is compared to a specified positive fraction (i.e., C) of the statistical measure $\beta_2(k)$ to determine whether or not the kth sample corresponds to a defect region. In particular, if the following inequality of Equation (6) is satisfied:

$$\beta_1(k) < C\beta_2(k), \quad (6)$$

then the kth sample is said to correspond to a defect region. Typical values for C are about 0.5-0.7.

Another way to implement the comparison of $\beta_1(k)$ and $\beta_2(k)$ is to compare the ratio of $\beta_1(k)$ to $\beta_2(k)$ to a threshold equal, for example, to the same specified fraction C. If the ratio is less than the threshold, then the kth sample corresponds to a defect region.

In general, the magnitude of a multi-bit LLR soft-decision value indicates the reliability of the detection processing of soft detector 144. As such, in normal regions, the soft-decision values typically have magnitudes larger than those in defect regions. This helps explain why the second ratio of statistical measures $\beta_1(k)$ and $\beta_2(k)$ fluctuates less than the first ratio of statistical measures $\alpha_1(k)$ and $\alpha_2(k)$. Note that, when the inequality of Equation (6) is satisfied indicating the detection of a defect region, the second statistical measure $\beta_2(k)$ is based on soft-decision values for normal regions, while the first statistical measure $\beta_1(k)$ is based on soft-decision values for the detected defect region, which typically have smaller magnitudes than the soft-decision values for normal regions. As a result, fluctuations in the second ratio are scaled down by the smaller magnitudes of the soft-decision values in the first statistical measure $\beta_1(k)$.

Note that, because Equations (3) and (4) generate the statistical measures $\beta_1(k)$ and $\beta_2(k)$ over a window of M samples, when the inequality $\beta_1(k)<C\beta_2(k)$ is satisfied, the determination may be made that the defect region begins a specified number of samples (e.g., M/2) before the kth sample. Furthermore, to avoid false positive detection of defect regions, the inequality may be required to be satisfied for a specified number of consecutive samples (or a specified number of samples in a given set of consecutive samples (e.g., for 7 of the last 10 samples)) before determining that a defect region has been detected.

Although the present invention has been described in the context of the two statistical measures $\beta_1(k)$ and $\beta_2(k)$ of Equations (3) and (4), respectively, the present invention can alternatively be implemented using other suitable statistical measures that are based on soft-decision values. Furthermore, there may be embodiments where only one of the statistical measures depends on soft-decision values.

In one possible implementation of defect detector 150, when the gap between the end of one defect region and the beginning of the next defect region is less than a specified distance apart, then the two defect regions and the intervening normal region are merged into one combined defect region, where the combined defect region spans from the beginning of the first defect region until the end of the second defect region.

Although the present invention has been described in the context of a read channel for a TMR (tunneling magneto-resistive) read head, those skilled in the art will appreciate that the present invention can be implemented in the context of other types of read heads, including, but not limited to, MR (magneto resistive) read heads or GMR (giant MR) read heads.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium or loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

What is claimed is:

1. A machine-implemented method for detecting a defect region on a hard drive, the method comprising:
   (a) the machine generating a first measure based on signal values, x[n] y[n] expected signal values corresponding to the signal values, and soft-decision values L[n] corresponding to the signal values;
   (b) the machine generating a second measure based on expected signal values and defect-free soft-decision values corresponding to only defect-free regions of the hard drive;
   (c) the machine comparing the first and second measures; and
   (d) the machine detecting the defect region based on the comparison of step (c).

2. The invention of claim 1, wherein:
the first measure is based on a moving average of products of (i) the signal values, (ii) the expected signal values, and (iii) magnitudes of the soft-decision values; and
the second measure is based on a moving average of products of (i) squares of the expected signal values and (ii) expectation values of the magnitudes of the defect-free soft-decision values.

3. The invention of claim 2, wherein:
the first measure $\beta_1(k)$ is given by:

$$\beta_1(k)=\Sigma_{i=0}^{M-1} y[k-i]\hat{y}[k-i]\text{abs}(L[k-i])$$

the second measure $\beta_2(k)$ is giving by:

$$\beta_2(k)=\Sigma_{i=0}^{M-1} \hat{y}[k-i]\hat{y}[k-i]E(\text{abs}(L))$$

wherein:
   y[k−i] is the (k−i)th signal value;

ŷ[k−i] is the expected value of the (k−i)th signal value;
L[k−i] is the soft-decision value for the (k−i)th signal value;
E(abs(L)) represents an expectation function applied to an absolute value of the defect-free soft-decision values; and
M is a specified positive integer.

4. The invention of claim 1, wherein the defect region is associated with either thermal asperity (TA) or media defect (MD).

5. The invention of claim 1, wherein the signal values are analog-to-digital converter (ADC) output values [n].

6. The invention of claim 1, wherein the signal values are equalizer input values x[n].

7. The invention of claim 1, wherein the signal values are equalizer output values y[n].

8. The invention of claim 1, wherein the comparison determines whether the first measure is less than a specified fraction of the second measure, where the specified fraction is less than one.

9. The invention of claim 1, wherein the comparison compares a ratio of the first measure and the second measure to a specified threshold.

10. The invention of claim 1, wherein the expected signal values are mean values of the signal values.

11. The invention of claim 10, wherein the expected signal values are functions of bit patterns associated with the signal values and one or more adjacent signal values.

12. The invention of claim 1, wherein the expected signal values are reconstructed from hard-decision values corresponding to the signal values.

13. The invention of claim 12, wherein the expected signal values are reconstructed by convolving the hard-decision values with a target polynomial.

14. A machine for detecting a defect region on a hard drive, the machine comprising:
(a) means for generating a first measure based on signal values, x[n] y[n] expected signal values corresponding to the signal values, and soft-decision values L[n] corresponding to the signal values;
(b) means for generating a second measure based on expected signal values and defect-free soft-decision values corresponding to only defect-free regions of the hard drive;
(c) means for comparing the first and second measures; and
(d) means for detecting the defect region based on the comparison of means (c).

15. The invention of claim 14, wherein the machine is a digital signal processor.

16. The invention of claim 14, wherein the machine is a hard-disc drive.

17. A non-transitory machine-readable storage medium, having encoded thereon program code, wherein, when the program code is executed by a machine, the machine implements a method for detecting a defect region on a hard drive, the method comprising:
(a) generating a first measure based on signal values, x[n] y[n] expected signal values corresponding to the signal values, and soft-decision values L [n] corresponding to the signal values;
(b) generating a second measure based on expected signal values and defect-free soft-decision values corresponding to only defect-free regions of the disk drive;
(c) the machine comparing the first and second measures; and
(d) the machine detecting the defect region based on the comparison of step (c).

18. The invention of claim 14, wherein:
the first measure is based on a moving average of products of (i) the signal values, (ii) the expected signal values, and (iii) magnitudes of the soft-decision values; and
the second measure is based on a moving average of products of (i) squares of the expected signal values and (ii) expectation values of the magnitudes of the defect-free soft-decision values.

19. The invention of claim 18, wherein:
the first measure $\beta_1(k)$ is given by:

$$\beta_1(k) = \sum_{i=0}^{M-1} y[k-i]\hat{y}[k-i]\text{abs}(L[k-i])$$

the second measure $\beta_2(k)$ is giving by:

$$\beta_2(k) = \sum_{i=0}^{M-1} \hat{y}[k-i]\hat{y}[k-i]E(\text{abs}(L))$$

wherein:
y[k−i] is the (k−i)th signal value;
ŷ[k−i] is the expected value of the (k−i)th signal value;
L[k−i] is the soft-decision value for the (k−i)th signal value;
E(abs(L)) represents an expectation function applied to an absolute value of the defect-free soft-decision values; and
M is a specified positive integer.

* * * * *

UNITED STATES PATENT AND TRADEMARK OFFICE
CERTIFICATE OF CORRECTION

PATENT NO.       : 8,089,713 B2
APPLICATION NO.  : 12/731381
DATED            : January 3, 2012
INVENTOR(S)      : Shaohua Yang and Weijun Tan Page 1 of 1

It is certified that error appears in the above-identified patent and that said Letters Patent is hereby corrected as shown below:

In column 7, line 12, claim 5, delete "[n]".

In column 7, line 14, claim 6, delete "x[n]".

In column 7, line 16, claim 7, delete "y[n]".

Signed and Sealed this
Sixteenth Day of October, 2012

David J. Kappos
*Director of the United States Patent and Trademark Office*